(12) United States Patent
Djayaprawira et al.

(10) Patent No.: US 7,771,570 B2
(45) Date of Patent: Aug. 10, 2010

(54) METHOD AND APPARATUS FOR DEPOSITING A MAGNETORESISTIVE MULTILAYER FILM

(75) Inventors: David Djulianto Djayaprawira, Tokyo (JP); Koji Tsunekawa, Tokyo (JP); Motonobu Nagai, Tokyo (JP)

(73) Assignee: Canon Anelva Corporation, Tokyo (JP)

(*) Notice: Subject to any disclaimer, the term of this patent is extended or adjusted under 35 U.S.C. 154(b) by 458 days.

(21) Appl. No.: 11/948,822

(22) Filed: Nov. 30, 2007

(65) Prior Publication Data

US 2008/0142156 A1  Jun. 19, 2008

Related U.S. Application Data

(62) Division of application No. 10/965,796, filed on Oct. 18, 2004, now Pat. No. 7,603,763.

(30) Foreign Application Priority Data

Oct. 16, 2003 (JP) ............... 2003-357108

(51) Int. Cl.
*C23C 14/00* (2006.01)
*C23C 14/32* (2006.01)
*G11B 5/33* (2006.01)
*G11B 5/127* (2006.01)

(52) U.S. Cl. ............... 204/192.2; 360/324.11; 360/324.12

(58) Field of Classification Search ............. 204/192.2; 360/113, 324.11, 324.12
See application file for complete search history.

(56) References Cited

U.S. PATENT DOCUMENTS 4,855,210 A 8/1989 Hirooka et al.
5,764,567 A 6/1998 Parkin ............... 365/173
5,768,071 A * 6/1998 Lin ............... 360/324.11
5,891,586 A 4/1999 Hasegawa et al. ........... 428/668
5,958,611 A 9/1999 Ohta et al.

(Continued)

FOREIGN PATENT DOCUMENTS

JP 62136663 A 6/1987

(Continued)

OTHER PUBLICATIONS

Japanese language office action and its English language translation for corresponding Japanese application 2003357108 lists the references above.

(Continued)

*Primary Examiner*—Alexa D Neckel
*Assistant Examiner*—Michael Band
(74) *Attorney, Agent, or Firm*—Hogan Lovells US LLP

(57) ABSTRACT

This application discloses a method and apparatus for manufacturing a magnetoresistive multilayer film having a structure where an antiferromagnetic layer, a pinned-magnetization layer, a nonmagnetic spacer layer and a free-magnetization layer are laminated on a substrate in this order. A film for the antiferromagnetic layer is deposited by sputtering as oxygen gas is added to a gas for the sputtering. A film for an extra layer interposed between the substrate and the antiferromagnetic layer is deposited by sputtering as oxygen gas is added to a gas for the sputtering. The film for the antiferromagnetic layer is deposited by sputtering as a gas mixture of argon and another gas of larger atomic number than argon is used.

9 Claims, 11 Drawing Sheets

U.S. PATENT DOCUMENTS

| | | |
|---|---|---|
| 5,981,014 A | 11/1999 | Tsukagoshi et al. |
| 6,093,444 A | 7/2000 | Miyauchi et al. ............ 427/128 |
| 6,201,671 B1 | 3/2001 | Pinarbasi |
| 6,268,036 B1 | 7/2001 | Marinero et al. |
| 6,301,088 B1 | 10/2001 | Nakada |
| 6,387,548 B1 | 5/2002 | Hasegawa et al. |
| 6,437,950 B1 * | 8/2002 | Chau et al. ............. 360/324.11 |
| 6,567,246 B1 | 5/2003 | Sakakima et al. ...... 360/324.11 |
| 6,641,703 B2 | 11/2003 | Nomura et al. |
| 6,709,767 B2 | 3/2004 | Lin et al. |
| 6,770,382 B1 | 8/2004 | Chang et al. |
| 6,781,799 B2 * | 8/2004 | Seyama et al. ......... 360/324.11 |
| 7,142,399 B2 | 11/2006 | Hasegawa et al. |
| 2002/0008947 A1 | 1/2002 | Hasegawa et al. |
| 2002/0085321 A1 | 7/2002 | Carey et al. |
| 2002/0101689 A1 | 8/2002 | Tang et al. |
| 2003/0030944 A1 | 2/2003 | Lin et al. |

FOREIGN PATENT DOCUMENTS

| | | | |
|---|---|---|---|
| JP | 08129721 A | 5/1996 |
| JP | 09129446 A | 5/1997 |
| JP | 10004226 A | 1/1998 |
| JP | 10329426 A | 12/1998 |
| JP | 11191647 A1 | 7/1999 |
| JP | 11296823 A | 10/1999 |
| JP | 11330588 A | 11/1999 |
| JP | 2001237471 A | 8/2001 |
| JP | 2001345493 A | 12/2001 |
| JP | 2002025822 A | 1/2002 |
| JP | 2002167661 A | 6/2002 |
| JP | 2003-86866 | 3/2003 |
| JP | 2003158313 A | 5/2003 |

OTHER PUBLICATIONS

Japanese language office action and its English language translation for corresponding Japanese application 2007322755 dated Sep. 15, 2009 lists the references above.

Japanese language office action and its English language translation for corresponding Japanese application 2007322755 dated Sep. 7, 2009 lists the references above.

* cited by examiner (1)  (2)

(3)

METHOD AND APPARATUS FOR DEPOSITING A MAGNETORESISTIVE MULTILAYER FILM

CROSS-REFERENCE TO RELATED APPLICATION

This application is a divisional of application Ser. No. 10/965,796, filed Oct. 18, 2004, the entire contents of which are incorporated by reference. This application also claims benefit of priority under 35USC 119to Japanese Patent Application No. 2003-357108, filed Oct. 16, 2003, the entire contents of which are incorporated by reference.

BACKGROUND OF THE INVENTION

1. Field of the Invention

This invention relates to manufacture of a magnetoresistive multilayer film utilized for such a magnetic device as giant magnetoresistive (GMR) effect element.

2. Description of the Related Art

The magnetic film technology has been significantly applied to magnetic devices such as magnetic heads and magnetic memories. For example, in magnetic disk drive units for external storages in computers, magnetic heads are mounted for read/write of information. In the field of memory devices, magnetic random access memories (MRAM) utilizing tunnel-type magnetoresistive films for memory elements have been developed. The MRAM are promising next-generation memory devices due to the rapidness of read/write and non-volatility.

In magnetic devices, the magnetoresistive effect is often utilized as means for converting magnetic fields into electric signals. The magnetoresistive effect is the phenomenon that electric resistance is varied according to variation of a magnetic field in a conductor. Especially, magnetic readout heads and MRAM utilize giant-magnetoresistive (GMR) films where the MR ratios are enormously high. "MR ratio" means magnetoresistance ratio, i.e., ratio of electric resistance variation against magnetic field variation. In the field of magnetic recording where further increase of recording density is demanded for enlarging storage capacity, it is necessary to capture slight variation of a magnetic field for reading out stored information. Therefore, the GMR film technology has been utilized in many kinds of magnetic heads, becoming the mainstream.

FIG. 10 is a schematic 3-D view showing the structure of an example of spin-valve type GMR films. The spin-valve type GMR film, hereinafter "SV-GMR film", has the basic structure where an antiferromagnetic layer 23, a pinned-magnetization layer 24, a nonmagnetic spacer layer (conduction layer) 25 and the free-magnetization layer 26 are laminated in this order. In the SV-GMR film, because the pinned-magnetization layer 24 is adjacent to the antiferromagnetic layer 23, magnetic moment in the pinned-magnetization layer 24 is pinned to a direction by the exchange coupling with the antiferromagnetic layer 23. On other hand, because the free-magnetization layer 26 is isolated from the pinned-magnetization layer 24 by the nonmagnetic spacer layer 25, magnetic moment in the free-magnetization layer 26 is capable of free directions in response to the external magnetic field variation.

The giant magnetoresistive effect on the SV-GMR film derives from spin-dependant scattering of electrons on the interface. When a couple of magnetic layers are magnetized to the same direction, free electrons, i.e., conduction electrons, are easily scattered at the interface. Contrarily, when the layers are not magnetized to the same direction, free electrons are hardly scattered at the interface. Therefore, when the magnetization direction in the free-magnetization layer 26 is closer to the one in the pinned-magnetization layer 24 as shown in FIG. 4, the electric resistance would decrease. When the magnetization direction in the free-magnetization layer 26 is closer to the opposite one to the pinned-magnetization layer 24, the electric resistance would increase. The structure performing this GMR effect is called "spin valve", because the magnetization direction in the free-magnetization layer 26 is spun against the pinned-magnetization layer 24, which is similar to turning a tap.

Tunnel-type magnetoresistive (TMR) films utilized in the MRAM have MR ratios several times as much as the GMR films. The TMR films are highly expected for next-generation magnetic heads, because of the higher MR ratios. As well as the GMR films, a TMR film has the structure where an antiferromagnetic layer, a pinned-magnetization layer, a nonmagnetic spacer layer and a free-magnetization layer are laminated in this order. The nonmagnetic spacer layer in the TMR film is a very thin film made of insulator, through which a tunnel current flows. Resistance on this tunnel current varies depending on the relative direction of magnetic moment in the free-magnetization layer against the pinned-magnetization layer.

The above-described magnetoresistive multilayer films are manufactured by laminating each thin film for each layer. Each film is deposited by sputtering or another method. In this, what is significant is that the giant-magnetoresistive effect in GMR films and TMR films derives from spin-dependant scattering of electrons on the interface as described. Accordingly, for obtaining a high MR ratio, what is significant is cleanness of the interface between a couple of layers. In depositing a film for a layer on an underlying layer, if a foreign substance is incorporated in the interface or a contaminant layer is formed in the interface, such a fault as MR ratio decrease might be brought. Accordingly, a chamber in which each film for each layer is deposited should be evacuated at a high-vacuum pressure so that the deposition is carried out in the clean environment. In addition, it is significant to shorten the period after the deposition for a layer until the next deposition for the next layer, and to maintain the clean environment continuously in the period.

Interfacial flatness in magnetoresistive multilayer films is also the significant factor in view of enhancing the product performance. Typically, when flatness is worse on the interface of the pinned-magnetization layer and the free-magnetization layer, the interlayer coupling would be generated, decreasing the product performance. This point will be described in detail as follows, referring to FIG. 11.

FIG. 11 shows the mechanism of the interlayer coupling generated from the worsened flatness of an interface. It is assumed in FIG. 11 that the magnetization layer 24 is formed as its surface is much roughened. This results in that the nonmagnetic spacer layer 25 and the free-magnetization layer 26 are also formed with the surfaces much roughened. If each surface of each layer 24,25,26 is completely flat, theoretically no magnetic poles would be induced in the interfaces. Contrarily, magnetic poles would be easily induced if the interfaces are roughened. For example, the magnetic lines in the angles of the roughened pinned-magnetization layer 24 generate poles at the ends because they terminate on the slopes of the angles. In the free-magnetization layer 26, the magnetic lines in the roots thereof generate poles at the ends.

When magnetic poles are induced on the interface between the pinned-magnetization layer 24 and the free-magnetization layer 26 as described, the interlayer coupling would take place between them, in spite of isolation by the nonmagnetic spacer layer 25. As a result, magnetic moment in the free-magnetization layer 26 would be captured by the pinned-magnetization layer 24, being incapable of the free rotation. If this happens, for example, in a magnetic readout head, readout signals would be asymmetrical against variation of the external magnetic field (the magnetic field on a storage medium). Otherwise, response of the readout head would be delayed to variation of the external magnetic field. These results might cause kinds of readout errors. In a MRAM, it might cause kinds of write-in errors and readout errors. It could also happen that magnetization direction in the free-magnetization layer 26 does not vary against magnetization direction in the pinned-magnetization layer 24 even when the external magnetic field varies. Therefore, the MR ratio tends to decrease when flatness of the interface is worsened.

The problems of the interlayer coupling and the interfacial roughness are discussed in J. Appl. Phys., Vol. 85, No. 8, p 4466-4468. This paper describes roughness is generated from the growth structure of a film. J. Appl. Phys., Vol. 7, No. 7, p 2993-2998 describes roughness of a film would be promoted when pressure in depositing the film is increased. After all, these papers teach that to decrease pressure in depositing a film is effective to make the interfacial roughness small for reducing the interlayer-coupling. However, J. Appl. Phys., Vol. 77, No. 7, p 2993-2998 also points out that intermixing, which means mutual incorporation of materials through an interface, would take place when pressure in depositing a film is decreased.

As another solution for the problem of the interlayer coupling caused by the interfacial roughness, it is considered to thicken the nonmagnetic spacer layer. However, when the nonmagnetic spacer layer is thickened in the SV-TMR film, the flow of conductive electrons not contributing to the GMR effect would be promoted, causing the problem of decreasing the MR ratio. The flow of those electrons is called "shunt effect". In the TMR film, on the other hand, if the nonmagnetic spacer layer of insulator is thickened, the whole resistance is increased, resulting in that the optimum tunnel current could be no longer obtained. This would cause the problem of decreasing the product performance.

There is still a further way to reduce roughness of an interface, which is shown in the Japanese laid-open No. 2003-86866. In this way, after the film deposition for a layer is carried out, the surface of the deposited film is treated utilizing plasma before the next film deposition for the next layer. However, an apparatus for this way accompanies the problem of scale enlargement because equipment for the plasma treatment is required. In addition, the problem of decreasing the productivity is also accompanied because the extra step of the plasma treatment is required.

SUMMARY OF THE INVENTION

This invention is to solve the above-described problems, and presents a method and apparatus for manufacturing a magnetoresistive multilayer film having a structure where an antiferromagnetic layer, a pinned-magnetization layer, a nonmagnetic spacer layer and a free-magnetization layer are laminated on a substrate in this order. In the method and the apparatus, a film for the antiferromagnetic layer is deposited by sputtering as oxygen gas is added to a gas for the sputtering. Otherwise, an extra layer is interposed between the substrate and the antiferromagnetic layer. A film for the extra layer is deposited by sputtering as oxygen is added to a gas for the sputtering. The film for the antiferromagnetic layer is deposited by sputtering as a gas mixture of argon and another gas of larger atomic number than argon is used as the sputtering gas.

DETAILED DESCRIPTION OF THE PREFERRED EMBODIMENTS

Figure 1:
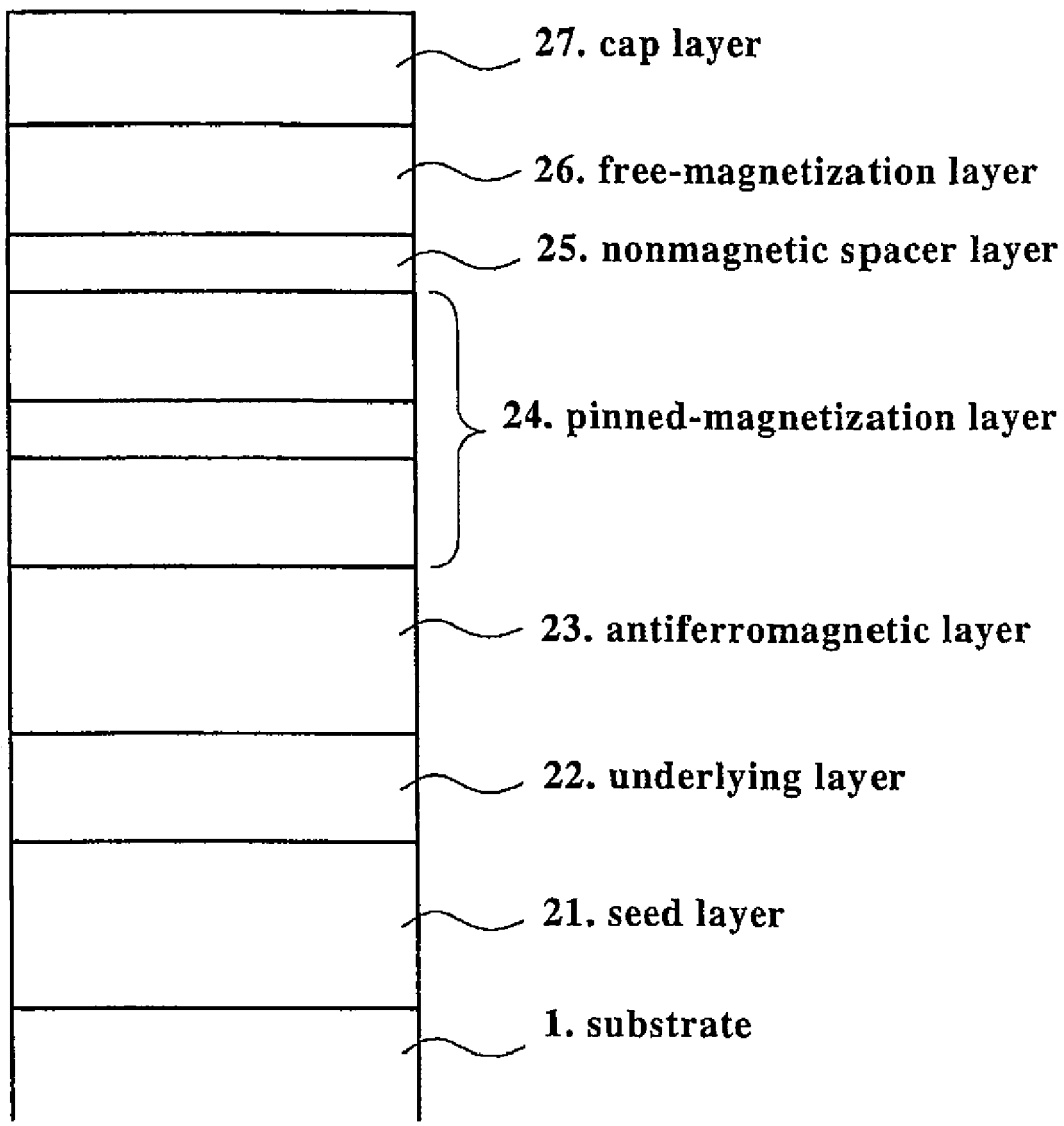
FIG. 1 is a schematic cross-sectional view showing the structure of a magnetoresistive multilayer film manufactured by the method and apparatus as embodiments of the invention.

The preferred embodiments of this invention will be described as follows. First of all, structure of a magnetoresistive multilayer film manufactured by the method and apparatus of the embodiments is described. FIG. 1 is a schematic cross-sectional view showing the structure of the magnetoresistive multilayer film manufactured by the method and apparatus of the embodiments. The magnetoresistive multilayer film shown in FIG. 1 is utilized for a magnetic head or MRAM, and works as a SV-GMR film or TMR film. The magnetoresistive multilayer film has the structure where a seed layer 21, an underlying layer 22, an antiferromagnetic layer 23, a pinned-magnetization layer 24, a nonmagnetic spacer layer 25, a free-magnetization layer 26 and a cap layer 27 are laminated in this order on a substrate 1.

In the magnetoresistive multilayer film, the zone formed of the pinned-magnetization layer 24, the nonmagnetic spacer layer 25 and the free-magnetization layer 26 essentially functions as the giant-magnetoresistive effect element. Therefore, the zone will be sometimes called "functional zone" in this specification. As shown in FIG. 1, the layers 21 to 27 are laminated upward in order. This does not always correspond to a structure in practical usage. FIG. 1 and the following description are just on the assumption that a layer formed in a prior step is located lower, and a layer formed in a later step is located upper. Therefore, if the surface of the substrate 1 is directed downward and the layers are laminated thereon, then the underlying layer 22 is located above the antiferromagnetic layer 23.

Figure 2:
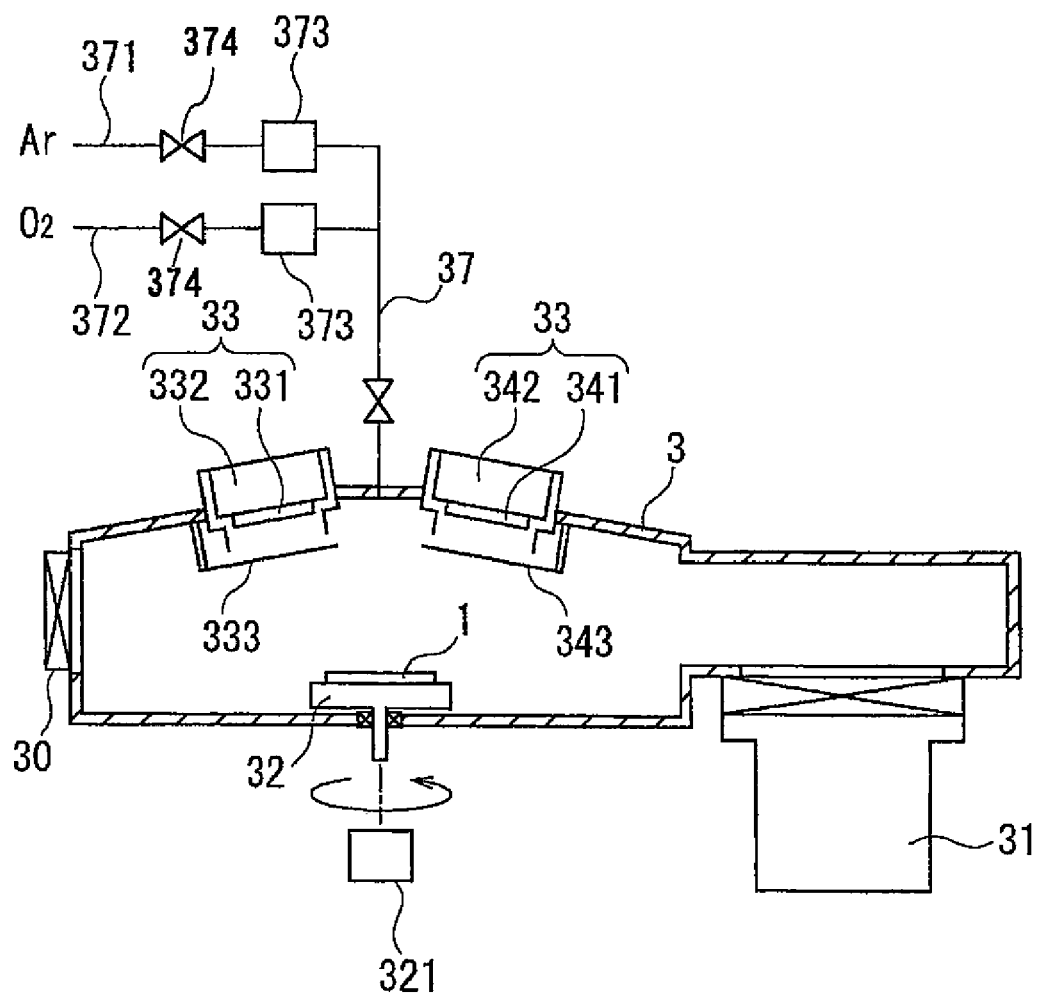
FIG. 2 is a schematic front cross-sectional view of a deposition chamber in the apparatus as the embodiment of the invention.

The magnetoresistive multilayer film is manufactured by sputter-deposition of each film for each layer. Therefore, the manufacturing apparatus comprises a deposition chamber. FIG. 2 is a schematic front cross-sectional view of the deposition chamber in the apparatus as the embodiment of the invention. As shown in FIG. 2, the apparatus comprises a pumping line 31 evacuating the deposition chamber 3, a substrate holder 32 holding a substrate 1 at a required position in the deposition chamber 3, a plurality of cathodes 33,34 igniting sputter discharge in the deposition chamber 3, and sputter power sources (not shown) applying voltage for sputtering to the cathodes 33,34.

The deposition chamber 3 is the air-tight vacuum chamber comprising an opening for transferring in and out the substrate 1. This opening is opened and closed by a gate valve 30. The pumping line 31 comprises such a vacuum pump as turbo-molecular pump, which evacuates the deposition chamber 3 through an evacuation room provided adjacent thereto. A gas introduction line 37 is provided for the deposition chamber 3 to introduce a gas for sputtering, hereinafter "sputtering gas", into the inside. The gas introduction line 37 is capable of adding oxygen gas to the sputtering gas. Concretely, argon is employed as the sputtering gas. The gas introduction line 37 comprises a pipe 371 for argon and another pipe 372 for oxygen. In addition to valves 374, the pipes 371,372 comprise gas flow controllers 373 so that the gases can be introduced at required flow rates. Though argon and oxygen are mixed and introduced together into the process chamber 3 in this embodiment, those may be introduced separately into the process chamber 3 and mixed therein.

The cathodes 33,34 are those for establishing the magnetron sputtering, namely magnetron cathodes. The cathodes 33,34 comprise targets 331,341 and magnet units 332,342. Though detailed structure of each magnet unit 332,342 is not shown in FIG. 2, a center magnet and an outer magnet surrounding the center magnet are provided. The magnetic field by each magnet unit 332,343 is in the orthogonal relation with the electric field by each cathode 33,34, establishing magnetron motion of electrons thereby. A rotation mechanism to rotate the magnet units 332,342 against the standing targets 331,341 may be provided for making erosions on the targets 331,341 more uniform. Shutters 333,343 are provided in fronts of the targets 331,341. Each shutter 333,343 covers each target 331,341 respectively when it is not used, thereby preventing it form being contaminated.

Though two cathodes 33,34 are shown in FIG. 2, three or more cathodes may be provided practically. Disclosure in the Japanese laid-open No. 2002-43159 can be referred to for structure and arrangement of the cathodes. The sputter power sources (not shown) are to apply negative DC voltages or RF (radio frequency) voltages to the cathodes 33,34 respectively. A controller (not shown) is provided for controlling input powers to the cathodes 33,34. It is preferable to control each input power to each cathode 33,34 independently from each other.

In this embodiment, one target 331 of one cathode 33 is made of tantalum because a tantalum film is deposited for the seed layer 21. Otherwise, such a material as copper or gold may be adopted for the seed layer 21. In this case, the target 331 is made of such a material. The seed layer 21 has the function of controlling crystal orientations in thin films for the upper layers laminated thereon.

A method for manufacturing the above-described magnetoresistive multilayer film will be described next. As oxygen gas is added, argon gas is introduced by the gas introduction line 37 at a required flow rate. In this state, when voltage is applied to the target 331 by one of the sputter power sources, sputter discharge is generated at the space in front of the target 331. Through the discharge, particles sputtered out of the target 331 reach the substrate 1, thereby depositing the tantalum film for the seed layer 21 on the substrate 1. The substrate holder 32 comprises a rotation mechanism 321. The rotation mechanism 321 rotates the substrate 1 against the standing target 331 so that the uniform film can be deposited. During this deposition, the other shutter 343 provided for the other cathode 34 is shut to prevent the target 341 from being contaminated.

In depositing another film using the other cathode 34, the other shutter 343 is opened as the shutter 333 is closed. The other one of sputter power sources is operated to carry out another sputter-deposition as well. In this embodiment, oxygen gas is not added to argon gas in depositing other films for the layers except the seed layer 21.

The magnetoresistive multilayer film shown in FIG. 1 is manufactured by sputter-depositions of thin films for the seed layer 21, the underlying layer 22, the antiferromagnetic layer 23, the pinned-magnetization layer 24, the nonmagnetic spacer layer 25, the free-magnetization layer 26 and the cap layer 29 in order on the substrate 1. The thin films may be deposited in the same deposition chamber 3 shown in FIG. 2, otherwise those may be deposited in deferent deposition chambers. In the case that the thin films are deposited in the same deposition chamber 3, each cathode and target for each film are provided therein. In this case, after the deposition under the oxygen gas addition it is preferable to evacuate the deposition chamber 3 to be at a high-vacuum pressure for eliminating residual oxygen gas prior to the next deposition. In the case that the thin films are deposited in deferent process chambers, therebetween the substrate 1 is transferred under a vacuum pressure without being exposed to the atmosphere.

The point that a little of oxygen gas is added in depositing the film for the seed layer 21 is based on a research by the inventors for solving the problem of the interlayer coupling. Interfacial roughness causing the problem of the interlayer coupling often results from roughness of another interface located thereunder. When the surface of a film is roughened, the surface of another film deposited thereupon is roughened as well, because the film is deposited as it traces the underlying roughened surface. Therefore, for preventing an interface from being roughened, it is significant to deposit the film located thereunder without roughness.

The inventors assumed that optimization of a film deposition method for a layer beneath the pinned-magnetization layer 24 would enable to flatten the interface between them. This assumedly would enable to flatten consequently the interface of the pinned-magnetization layer 24 and the free-magnetization layer 26, which contributes to reduction of the interfacial coupling. Through the diligent research on this assumption, it has turned out that addition of oxygen gas to the sputtering gas in depositing a film for a layer beneath the pinned-magnetization layer 24 enables reduction of the interlayer coupling. This point will be described in detail as follows.

Figure 3:
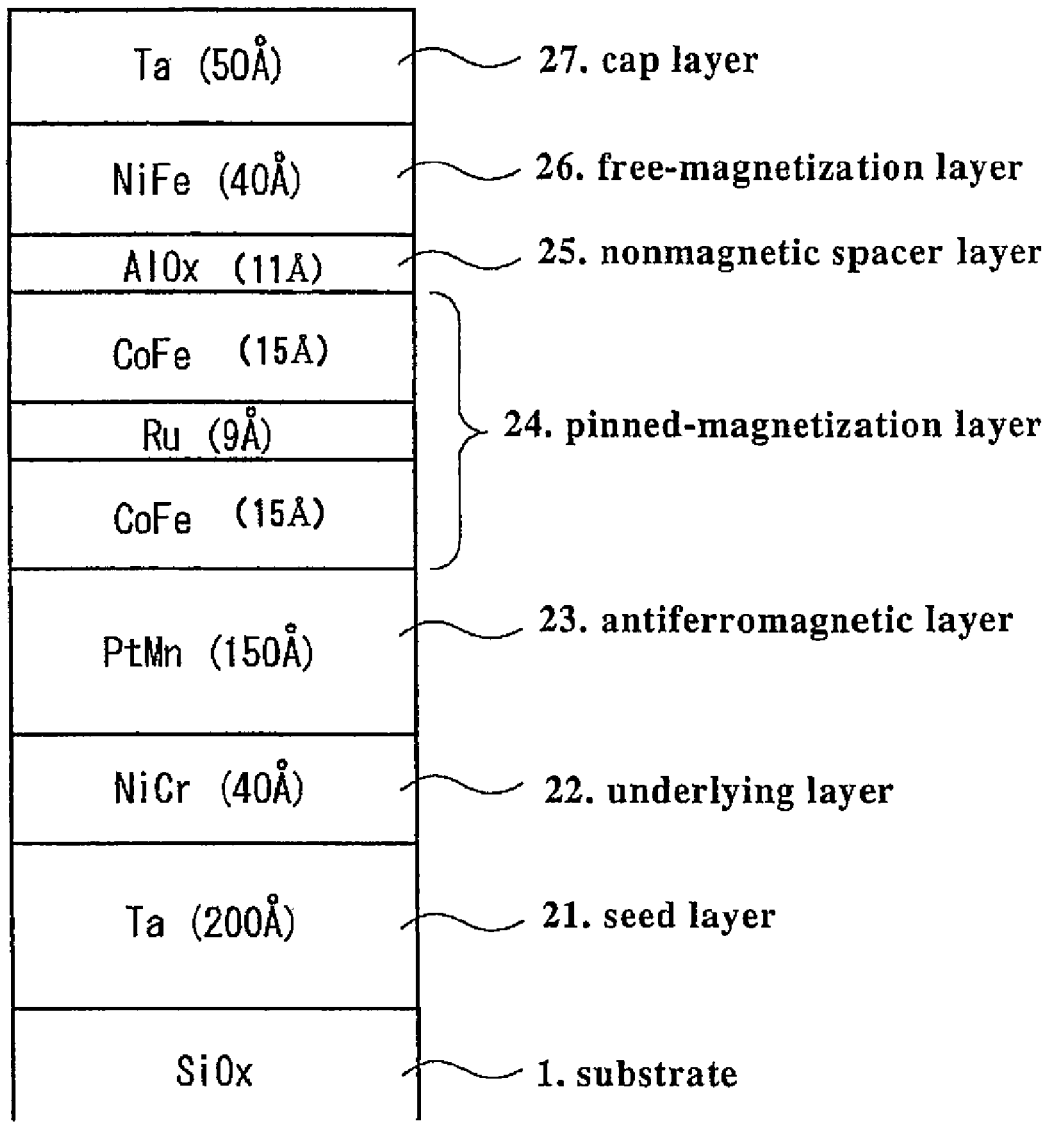
FIG. 3 schematically shows the structure of a TMR film prepared in an experiment for confirming the effect of oxygen gas addition in depositing a film for the seed layer.

FIG. 3 schematically shows the structure of TMR films prepared in an experiment for confirming the effect of oxygen gas addition in depositing a film for the seed layer. Numerals in the parentheses in FIG. 3 mean thickness of the films. As shown in FIG. 3, a tantalum film for the seed layer 21 was deposited at 200 angstrom thickness on the thermally oxidized surface of a silicon-made substrate 1. On the tantalum film, a NiCr film for the underlying layer 22 was deposited at 40 angstrom thickness. On the NiCr film, a PtMn film (Pt50Mn50 at %) for the antiferromagnetic layer 23 was deposited at 150 angstrom thickness. On the PtMn film, for the pinned-magnetization layer 24 a couple of CoFe films (Co90Fe10 at %) are deposited at 30 angstrom thickness respectively, interposing a Ru film of 30 angstrom thickness. On the CoFe films, an alumina film for the nonmagnetic spacer layer 25 was deposited at 9 angstrom thickness. On the alumina film, a NiFe film (Ni83Fe17 at %) for the free-magnetization layer 26 was deposited at 40 angstrom thickness. On the NiFe film, a tantalum film for the cap layer 29 was deposited at 50 angstrom thickness. The abbreviation "at %" means "atomic numeral ratio". This means weight ratio converted by atomic number, i.e., ratio of the numbers of included atoms. For example, "Pt50Mn50 at %" means platinum of 50% atomic numeral ration and manganese of 50% atomic numeral ratio. And, "NiCr" means material components of nickel and chromium, and does not always mean they are alloyed though often alloyed. This is the same as in other expressions using other combinations of the element symbols, such as "PtMn", "CoFe" and the like.

Figure 4:
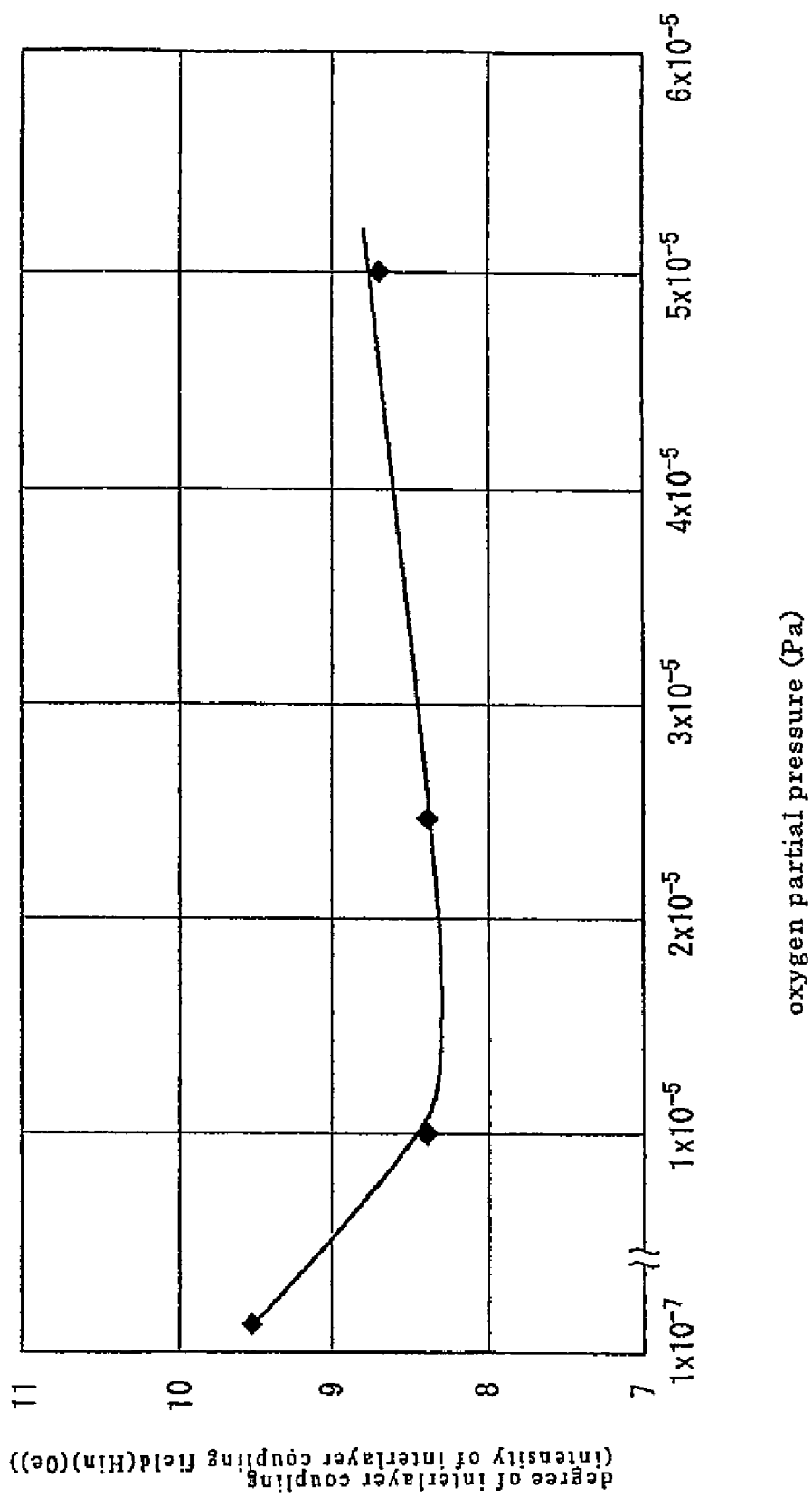
FIG. 4 shows an experimental result in relationship between volume of added oxygen gas in depositing the film for the seed layer and degree of the interlayer coupling.

The TMR films of the above-described structure were prepared, as oxygen partial pressure in depositing the tantalum films for the seed layers is varied. Then, intensity of the interlayer coupling of the pinned-magnetization layer 24 and the free-magnetization layer 26 was measured in each TMR film. Argon was used as the sputtering gas, where its partial pressure was constantly $3.2 \times 10^{-2}$ Pa. FIG. 4 shows the experimental result in relationship between volume of added oxygen gas in depositing the films for the seed layers and degree of the interlayer coupling. In FIG. 4, the abscissa axis is oxygen partial pressure, and the ordinate axis is degree of the interlayer coupling, i.e., intensity of the interlayer-coupling magnetic field (Oe), between the pinned-magnetization layer 24 and the free-magnetization layer 26. Actual data are shown in Table 1.

TABLE 1

Relationship of oxygen partial pressure in tantalum film deposition and degree of the interlayer coupling

| Oxygen partial pressure in Ta film deposition (Pa) | Degree of the interlayer Coupling (Oe) |
|---|---|
| $1.2 \times 10^{-6}$ | 9.5 |
| $1.0 \times 10^{-5}$ | 8.4 |
| $2.5 \times 10^{-5}$ | 8.4 |
| $5.0 \times 10^{-5}$ | 8.7 |

As shown in FIG. 4 and Table 1, at zero addition of oxygen gas the interlayer coupling was about 9.7 Oe. As oxygen addition was increased, the interlayer coupling decreased. At the low oxygen partial pressure of $1.2 \times 10^{-6}$ Pa, the interlayer coupling was still the high value of 9.5 Oe. However, the oxygen partial pressure was increased at $1.0 \times 10^{-5}$ Pa, it decreased at 8.4 Oe. It was the same low value even when the oxygen partial pressure was increased to $2.5 \times 10^{-5}$ Pa. It still remained at the low value of 8.7 Oe even when the oxygen partial pressure was increased to $5.0 \times 10^{-5}$ Pa. This result teaches the oxygen partial pressure is preferably $1.0 \times 10^{-5}$ Pa or more.

Figure 5:
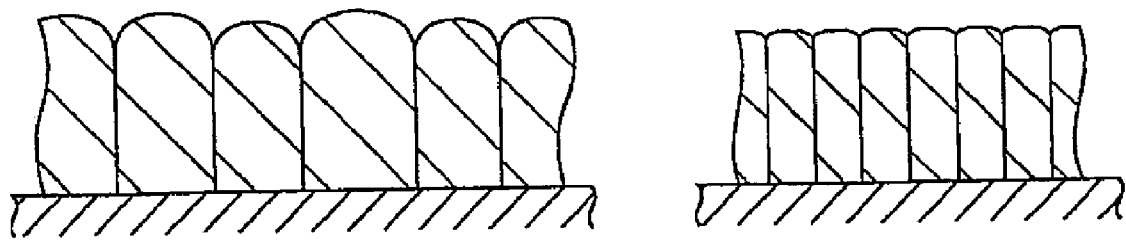
FIG. 5 schematically shows an assumed mechanism of the interlayer coupling decrease by oxygen gas addition.
Figure 5:
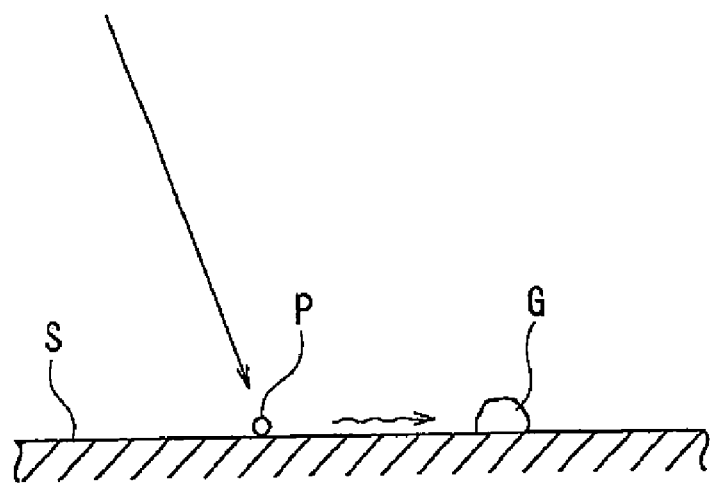

Though it has not been clear why the interlayer coupling decreases under oxygen gas addition, there might be one possibility that the film was flattened by oxygen gas addition. This point will be described, referring to FIG. 5. FIG. 5 schematically shows the assumed mechanism of the interlayer coupling decrease by oxygen gas addition.

As described in J. Appl. Phys., Vol. 77, No. 7, p 2993-2998, surface roughness of a deposited film supposedly derives from its crystal growth structure. Though some kinds of films are deposited in amorphous states, a magnetic film as in this embodiment is deposited in a state that crystals of certain largeness grow. In this, each crystal grows to be columnar as shown in FIG. 5(1) (2). Surface roughness of the deposited film appears outlining the top of each columnar crystal.

When each crystal is large-size as shown in FIG. 5(1), roughness tends to increase. When each crystal is small-size as shown in FIG. 5(2), roughness tends to decrease. On the other hand, situation where each crystal grows should be taken into consideration. In FIG. 5(3), it is assumed that particles 41, i.e., atoms or molecules, arrive at a surface 42. Each crystal gradually grows by accumulation of the arriving particles 41. In this growth, the particles 41 having arrived at the surface 42 would migrate thereon. The migrating particles 41 are sometimes incorporated into crystal grains 43 that have been formed. By incorporation of the particles 41, the crystal grains 43 gradually expand. In this, if oxygen exists in the ambience, supposedly it would inhibit clustering in the crystal growth of the particles 41. As a result, the crystal grains 43 are hard to expand, remaining small-size. Clustering in this means expansion of the crystal grains 43 by incorporation of the particles 41.

Though the concrete mechanism of the grain-size decrease has not been completely clear, it is supposed that it derives from surface oxidization of the crystal grains made of tantalum. Because tantalum atoms on the oxidized surface are in ionic bonds with oxygen atoms, free electros that should have been due to metallic bonds with other tantalum atoms would be incorporated into orbits in the oxygen atoms. As a result, even when other tantalum atoms migrate to be nearby, they could not bond with the surface atoms on the crystal grains. Supposedly this is why the crystal grains remain small-size as shown in FIG. 5(2), making the film fine-crystal-structured.

When the tantalum film for the seed layer 21 grows with such a fine crystal structure, the surface of the seed layer 21 is flattened. Thus, the underlying layer 22, the antiferromagnetic layer 23, the pinned-magnetization layer 24, the nonmagnetic spacer layer 24 and the free-magnetization layer 26 laminated thereon would have the flattened surfaces as well. Therefore, the interfaces in the functional zone are flattened as well, resulting in that the interlayer coupling decreases. This is supposedly the mechanism of the described interlayer-coupling decrease.

Anyway, the method and the apparatus of this embodiment reduces the interlayer coupling of the pinned-magnetization layer 24 and the free-magnetization layer 26, by adding a little of oxygen gas to the sputtering gas in depositing the film for the seed layer 21. Accordingly, there is less probability that magnetic moment in the free-magnetization layer 26 would be captured and restricted by magnetic moment in the pinned-magnetization layer 24. This brings the merit of reducing readout errors and response delays in a magnetic readout head, and the merit of reducing write-in errors and readout errors in a MRAM. Because this solution is not to add such an extra step as plasma treatment, it does not accompany the problem of increasing the apparatus cost, nor accompany the problem of decreasing the productivity caused by lead-time extension for the extra step.

The following is description about the second embodiment of this invention. This embodiment is characterized by that oxygen gas is added to the sputtering gas in depositing a film not for the seed layer 21 but for the antiferromagnetic layer 23. Concretely, a deposition chamber for depositing the film for the antiferromagnetic layer 23 comprises a gas introduction line introducing the sputtering gas. The gas introduction line is capable of adding oxygen gas to the sputtering gas. Structure of the deposition chamber may be the same as of the one in the first embodiment shown in FIG. 2, except that the target is made of the same material as the antiferromagnetic layer 23 to form, e.g. PtMn, InMn or the like.

Figure 6:
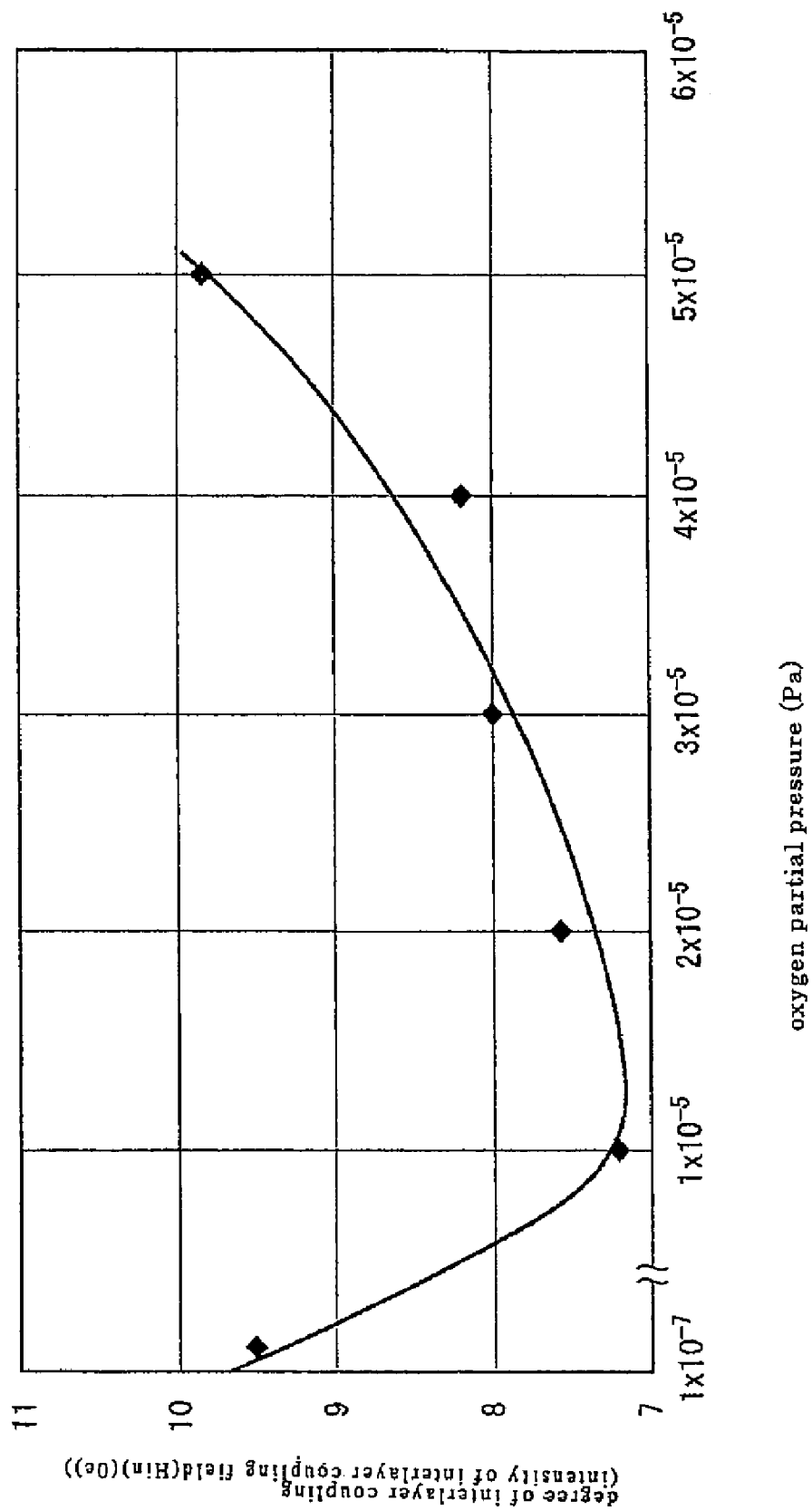
FIG. 6 shows an experimental result in relationship between volume of added oxygen gas in depositing a film for the antiferromagnetic layer and degree of the interlayer coupling.

Oxygen gas addition in depositing the film for the antiferromagnetic layer 23 is also based on the result of an experiment by the inventors. FIG. 6 shows an experimental result in relationship between volume of added oxygen gas in the film depositing for the antiferromagnetic layer and degree of the interlayer coupling. In FIG. 6 as well, the abscissa axis is oxygen partial pressure, and the ordinate axis is degree of the interlayer coupling between the pinned-magnetization layer 24 and the free-magnetization layer 26. Actual data in the result are shown in Table 2.

TABLE 2

Relationship of oxygen partial pressure in PtMn film deposition and degree of the interlayer coupling

| Oxygen partial pressure in PtMn film deposition (Pa) | Degree of the interlayer Coupling (Oe) |
|---|---|
| $1.2 \times 10^{-6}$ | 9.5 |
| $1.0 \times 10^{-5}$ | 7.2 |
| $2.0 \times 10^{-5}$ | 7.6 |
| $3.0 \times 10^{-5}$ | 8.0 |
| $4.0 \times 10^{-5}$ | 8.2 |
| $5.0 \times 10^{-5}$ | 9.8 |

TMR films having the same structure as in FIG. 1 were prepared in this experiment. In each preparation, a PtMn film for the antiferromagnetic layer 23 was deposited at 150 angstrom thickness as well. Argon was used for the sputtering gas in the PtMn film deposition, as argon partial pressure was kept constantly at 0.165 Pa.

As well as the described experiment, at zero addition of oxygen gas the interlayer coupling was about 9.7 Oe. As added oxygen gas volume was increased, the interlayer coupling decreased as shown in FIG. 6 and Table 2. At the low oxygen partial pressure of $1.2 \times 10^{-6}$ Pa, the interlayer coupling was still the high value of 9.5 Oe. However, the oxygen partial pressure was increased at $1.0 \times 10^{-5}$ Pa, it decreased at 7.2 Oe. It still remained at the low value of 7.6 to 8.0 Oe, even when the oxygen partial pressure was increased in $2.0 \times 10^{-5}$ to $3.0 \times 10^{-5}$ Pa. Even when the oxygen partial pressure was increased at $4.0 \times 10^{-5}$ Pa, it was the low value of 8.2 Oe. This result teaches the oxygen partial pressure is preferably in the range of $1.0 \times 10^{-5}$ to $4.0 \times 10^{-5}$ Pa.

Reduction of the interlayer coupling by oxygen gas addition in the film deposition for the antiferromagnetic layer 23 is considered to have the similar mechanism to the described one. That is, it supposedly derives from the fine crystal structure of the film as a result of that surfaces of crystal grains are slightly oxidized. As understood from the above-described result, it is also preferable, supposedly more preferable, to add oxygen gas to the sputtering gas in both film depositions for the seed layer 21 and for the antiferromagnetic layer 23.

Anyway, because the interlayer coupling is reduced in this embodiment as well, it is possible to manufacture a high-quality magnetoresistive multilayer film with much less probability that magnetic moment in the free-magnetization layer 26 would be captured and restricted by magnetic moment in the pinned-magnetization layer 24. Therefore, it is much preferable for a magnetic readout head and MRAM. Moreover, it accompanies neither increase of the apparatus cost nor decrease of the productivity, because no extra step such as plasma treatment is added.

It is supposed that the thin-film flattening by the slight addition of oxygen gas would function similarly in thin-film depositions for layers other than the seed layer 21 and the antiferromagnetic layer 23. Therefore, oxygen gas may be added in a thin-film deposition for another layer, i.e., the underlying layer 22, the pinned-magnetization layer 24, the nonmagnetic spacer layer 25 or the free-magnetization layer 26. Still, attention should be paid for oxygen gas addition in the thin-film depositions for the functional zone, e.g. for the pinned-magnetization layer 24, because it might much affect the product property even in the case of small volume.

As described, the thin-film flattening by small-volume oxygen gas addition supposedly derives from free-electron incorporation through ionic bonding of atoms on crystal grain surfaces with oxygen atoms. On this assumption, the same effect might be brought by another gas than oxygen, e.g. nitrogen, fluorine, chlorine, or the like. Still, attention should be paid as well to use of those gases, because those are much reactive, and because those might bring a problem of erosion or property deterioration.

Figure 7:
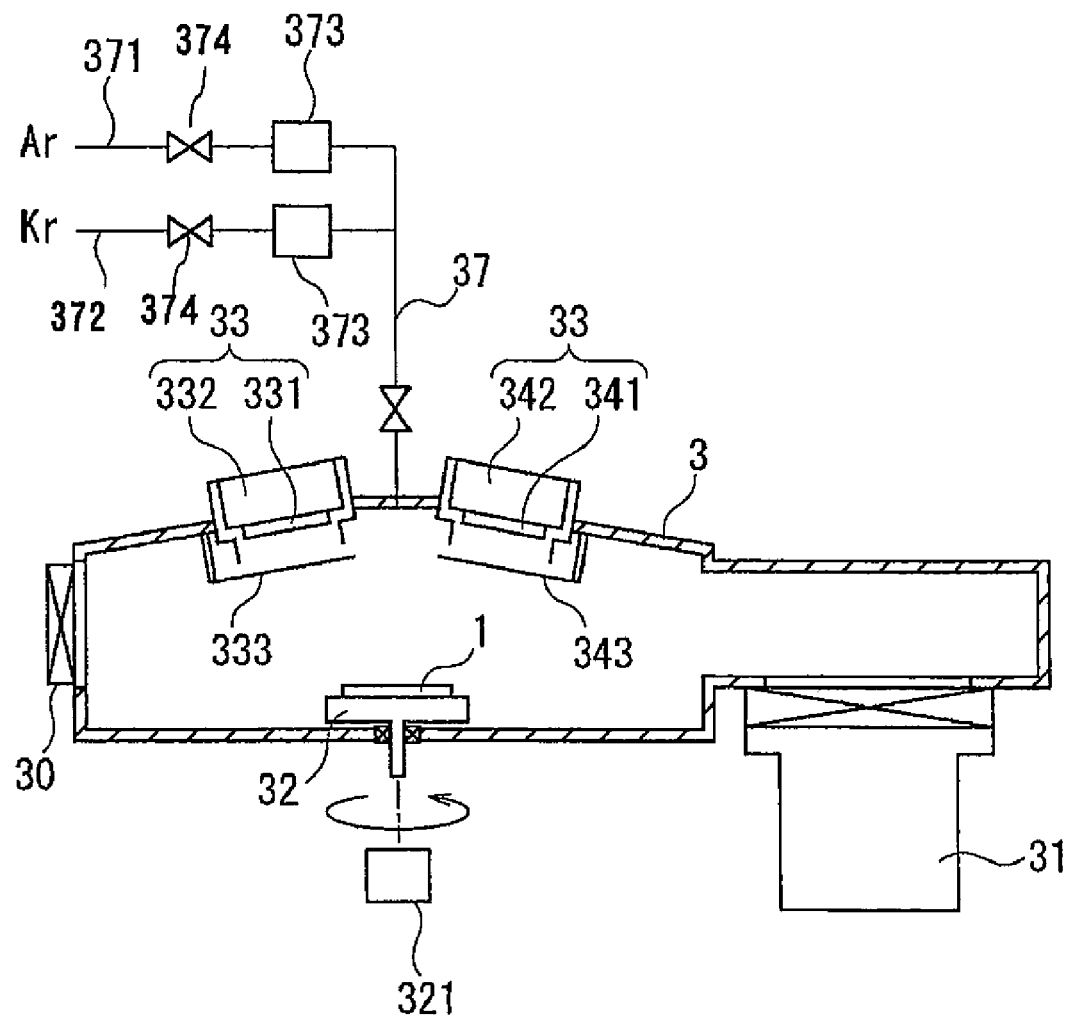
FIG. 7 is a schematic front cross-sectional view of a deposition chamber in the apparatus as the third embodiment of the invention.

Next, the third embodiment of the invention will be described. This embodiment is characterized by use of the gas mixture of argon and krypton, hereinafter "ArKr mix", as the sputtering gas in the thin-film deposition for the antiferromagnetic layer 23. FIG. 7 is a schematic front cross-sectional view of a deposition chamber in the apparatus as the third embodiment of the invention. The deposition chamber 3 shown in FIG. 7 is for depositing a thin film for the antiferromagnetic layer 23, where one of targets is made of material of the antiferromagnetic layer 23, e.g. PtMn or IrMn. As shown in FIG. 7, a gas introduction line 37 provided for the deposition chamber 3 comprises a pipe 371 for argon gas and another pipe 374 for krypton gas. The pipes 371, 372 comprise gas flow controllers 373 so that argon gas and krypton gas can be introduced at a required mixture ratio. Those gases may be introduced separately into the deposition chamber 3 and mixed therein.

Use of ArKr mix in the thin-film deposition for the antiferromagnetic layer 23 is also based on the result of an experiment by the inventors pursuing reduction of the interlayer coupling. Assuming that thin-film flattening for reducing the interlayer coupling is enabled by optimizing selection and flow-rate of the sputtering gas in the film deposition for the antiferromagnetic layer 23, the inventors executed the diligent research. Then, prominent reduction of the interlayer coupling was confirmed when ArKr mix was used at the krypton mixture ratio of 10% or more.

Figure 8:
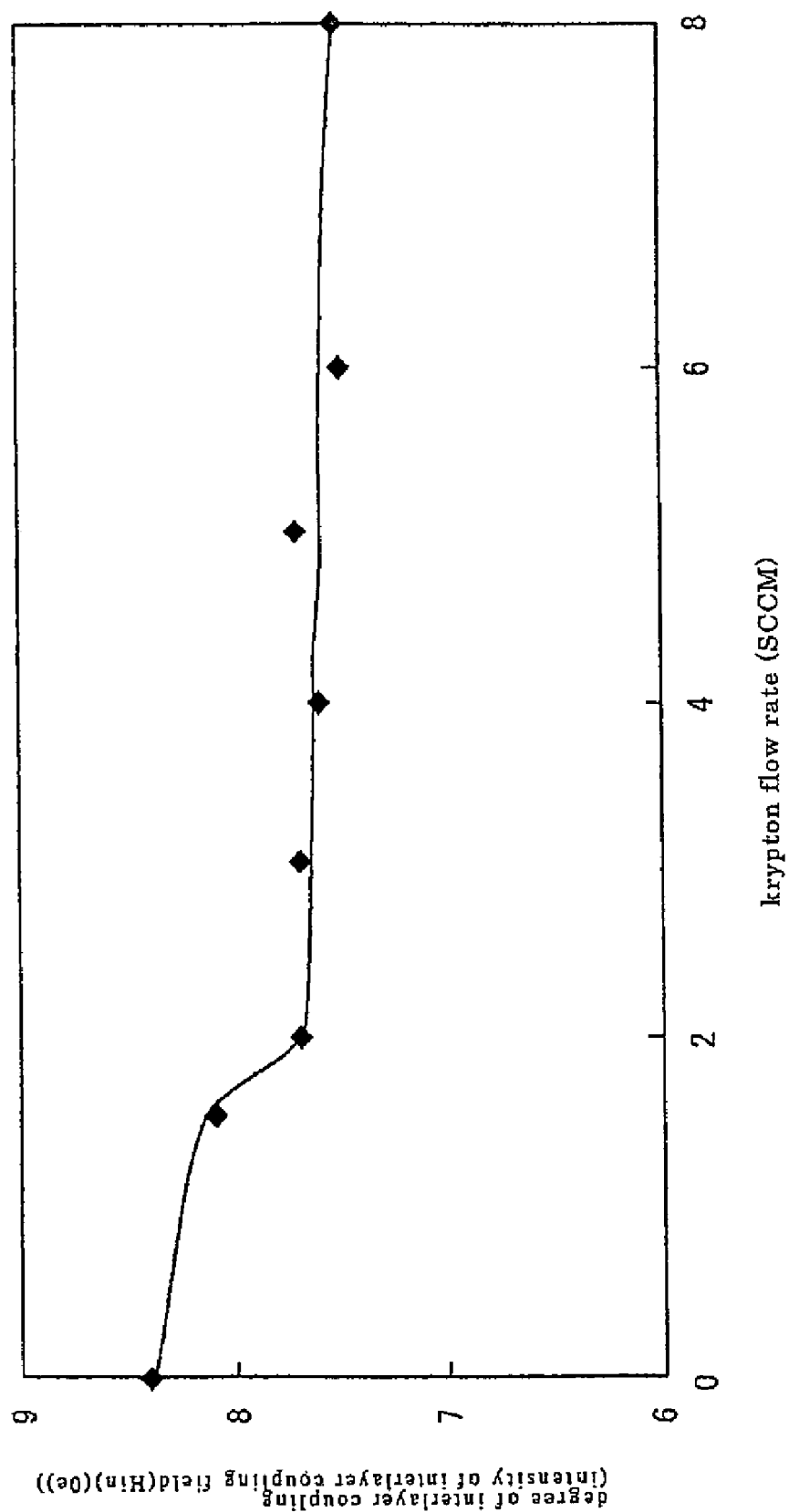
FIG. 8 shows the result of an experiment where a film for the antiferromagnetic layer was deposited using the gas mixture of argon and krypton.

FIG. 8 shows the result of an experiment where films for the antiferromagnetic layers 23 were deposited using the ArKr mix. In FIG. 8, the abscissa axis is the flow rate of krypton gas (SCCM), and the ordinate axis is degree of the interlayer coupling between the pinned-magnetization layer 24 and the free-magnetization layer 26. Actual data in FIG. 8 are shown in Table 3. "SCCM" stands for "Standard Cubic Centimeter per Minute", which means gas flow rate per minute converted at 0° C. and 1 atm.

TABLE 3

Relationship of Kr flow rate in PtMn film deposition and degree of the interlayer coupling

| Kr flow rate (SCCM) | Interlayer Coupling (Oe) |
| --- | --- |
| 0 | 8.4 |
| 1.5 | 8.1 |
| 2 | 7.7 |
| 3 | 7.7 |
| 4 | 7.6 |
| 5 | 7.7 |
| 6 | 7.5 |
| 8 | 7.5 |

Figure 9:
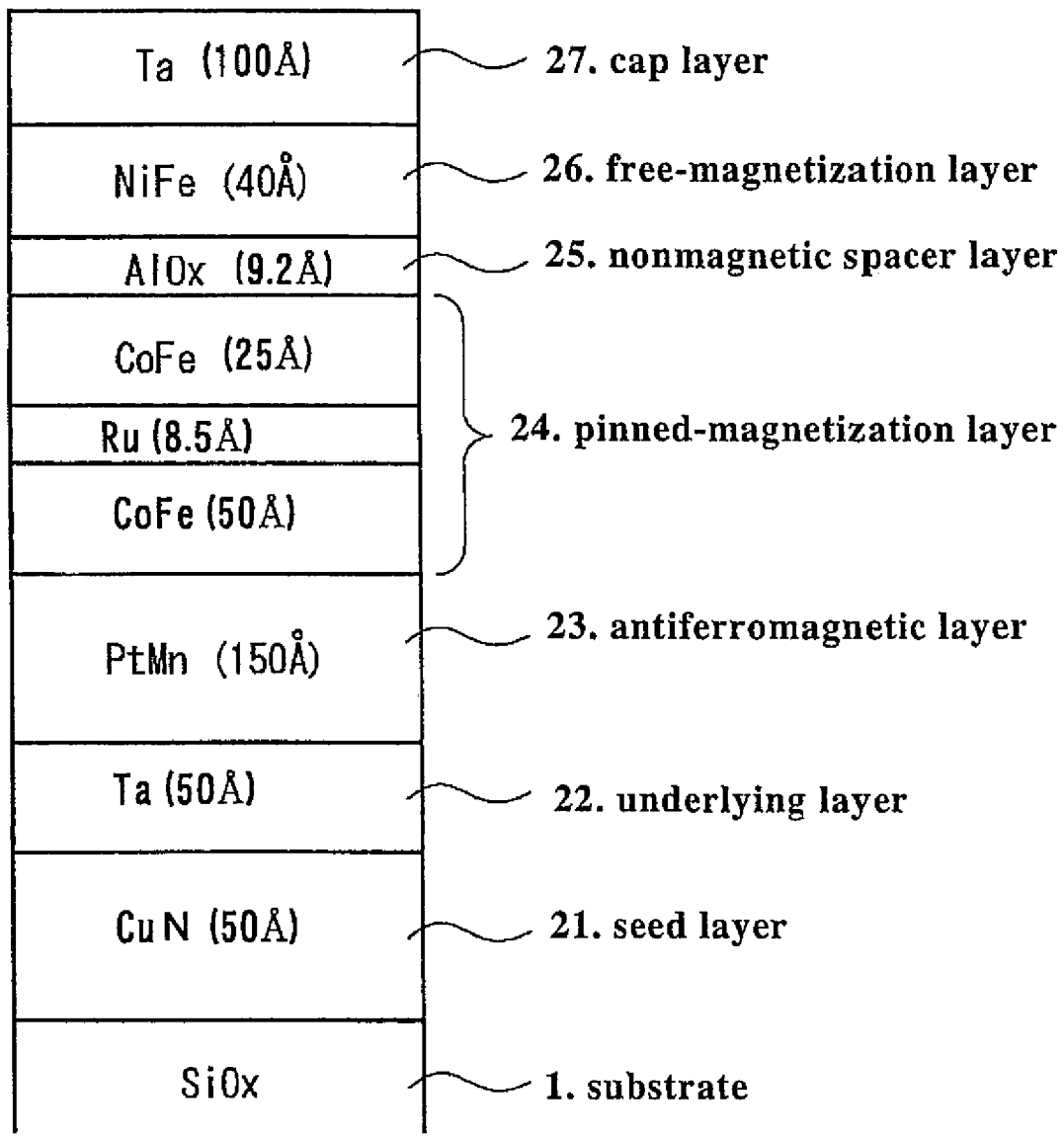
FIG. 9 schematically shows the structure of a TMR film prepared in the experiment.
Figure 10:
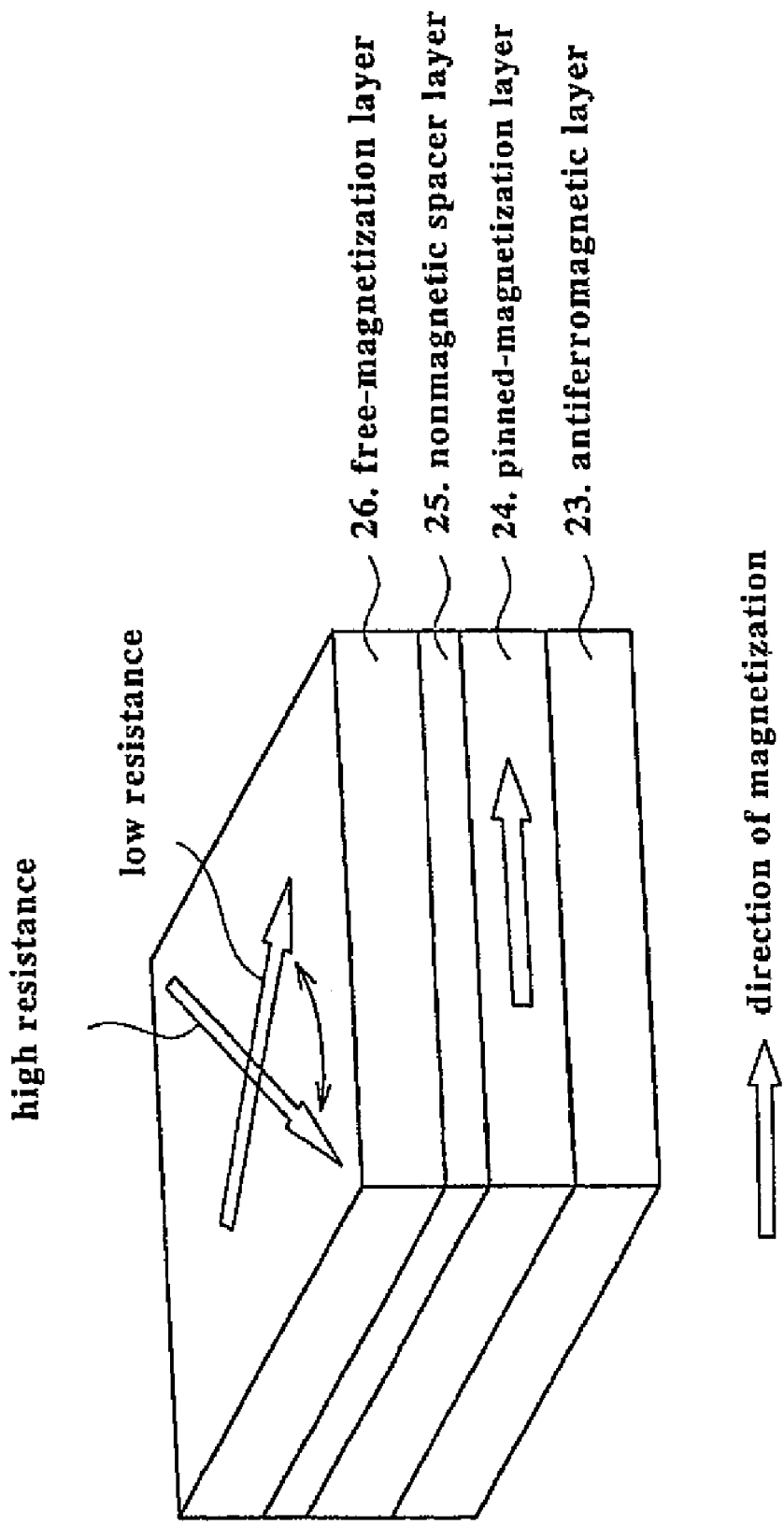
FIG. 10 is a schematic 3-D view showing the structure of an example of the SV-GMR films.
Figure 11:
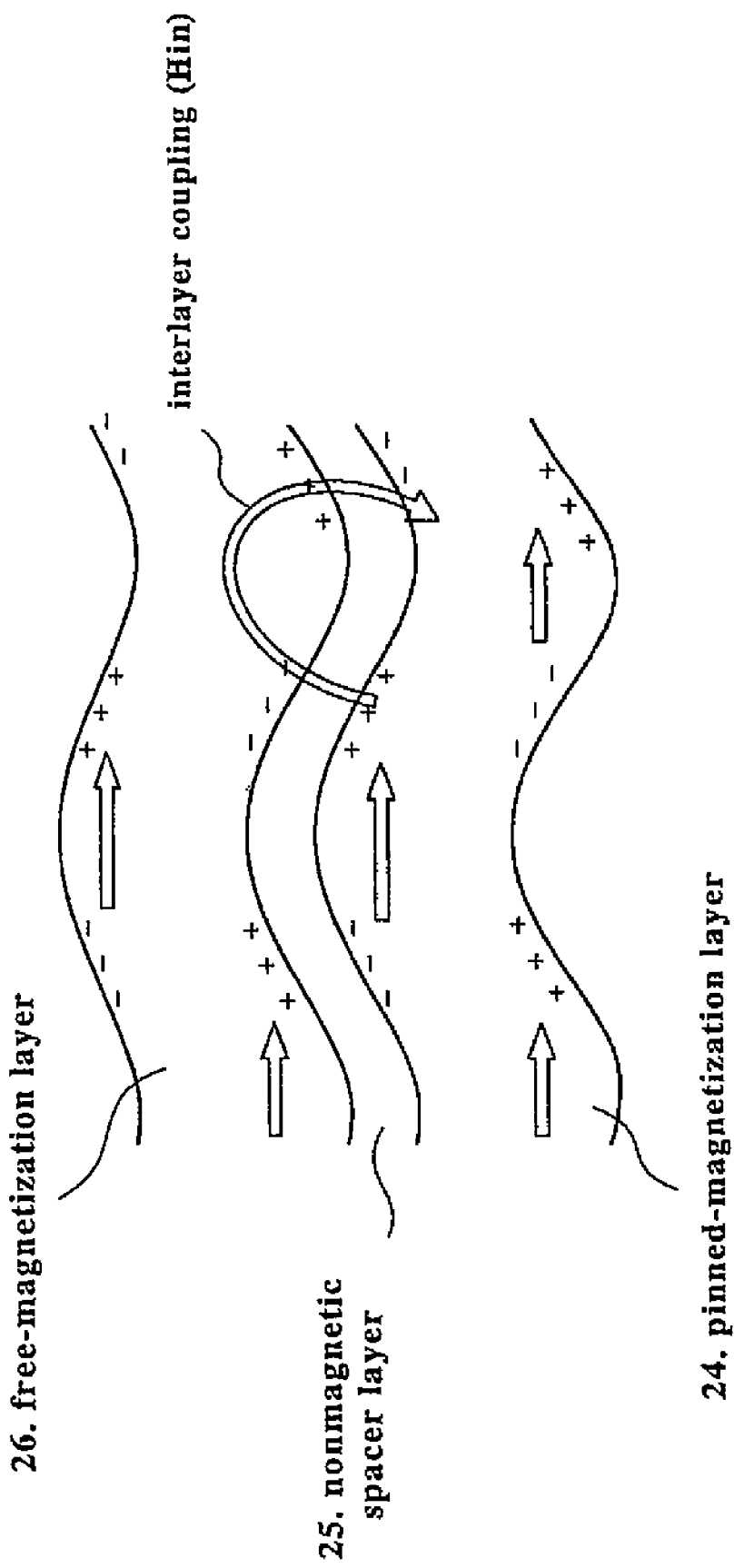
FIG. 11 shows the mechanism of the interlayer coupling deriving from the worsened flatness of an interface.

In this experiment, TMR films were prepared as well. Structure of the films is shown in FIG. 9, which has minor differences from the described one. Numerals in the parentheses in FIG. 9 also mean thickness of the films. In preparing each TMR film, ArKr mix is used for the PtMn film deposition for the antiferromagnetic layer 23. As the total flow rate of ArKr mix was kept constantly at 20 SCCM, krypton flow rate was varied. Then, it was investigated how degree of the interlayer coupling differs depending on the krypton flow rate. The total pressure during the deposition was $6.0 \times 10^{-2}$ Pa.

As shown in FIG. 8, the interlayer coupling was the high values of 8.4 to 8.1 Oe under the krypton flow rate of 0 to 1.5 SCCM. However, it dropped down to 7.7 Oe under 2 SCCM. As krypton flow rate was increased further, the interlayer coupling remained at the low values of 7.7 to 7.5 Oe. From this result, it has turned out that krypton flow rate is preferably 2 SCCM or more. It means that krypton mixture ratio is preferably 10% or more. From the result shown in FIG. 8, a higher krypton mixture ratio, e.g. 50 to 100%, may be preferable. However, it might bring a problem in cost because krypton is the expensive gas.

Generally, when a voltage is applied to a target for sputtering, in addition to atoms of the target secondary electrons are released from the target bombarded by ions of the sputtering gas. Atoms punched out from the target in sputtering are called "sputter-atoms". Some gaseous ions bombarding the target are reflected or scattered without losing their charges, Moreover, some gaseous ions are reflected or scattered on the target with their charges lost, becoming neutral gaseous atoms: These neutral gaseous atoms, which are hereinafter called "recoil atoms", spring out from the target at high speeds.

When the recoil atoms strike the film being deposited on the substrate, they would be incorporated into the film to generate stress therein. On the other hand, the recoil atoms would function to impede clustering of crystals. Sputter-atoms reaching an underlying surface or the surface of the film being deposited would migrate thereon. The recoil atoms bombarding the surfaces would impede the migration of the sputter-atoms.

The migration impediment effect by the bombarding recoil atoms depends on the atomic number difference of the recoil atoms from the sputter-atoms. The migration impediment is more effective if atomic number of the bombarding recoil atoms is larger than the sputter-atoms. Contrarily, it is less effective if atomic number of the recoil atoms is smaller than the sputter-atoms.

In addition, the recoil atoms bombarding the film being deposited have the function of re-sputtering thereon. Degree of the re-sputtering depends on the kind of the recoil atoms, which is similar to the sputtering yield by the sputtering gas on the target. If atomic number of the recoil atoms is larger than atoms composing the film, i.e., than the sputter-atoms, then degree of the re-sputtering is high.

The film having the fine crystal structure and the flattened surface is supposedly obtained by adequately balancing the migration impediment function and the re-sputtering function both by the recoil atoms. In this, there would be a problem if the target is made of different kinds of atoms having much difference in atomic number such as Pt (atomic number 78) and Mn (atomic number 25), intending to deposit a film of such materials. When a sputtering gas with large atomic number is used, which means atomic number of the recoil atoms is large, atoms of smaller atomic number would be punched out from the film being deposited, through the re-sputtering by the recoil atoms. As a result, the deposited film can not be expected to have a required components ratio.

Therefore, an optimum range of the gas mixture ratio should be determined according to the relationship between contents of the film, i.e., materials and components ratio, and atomic number of a gas mixture used for the deposition. In the case of PtMn film deposition using ArKr mix, it has turned out that antiferromagnetism can be obtained on the desired components ratio of 50Pt50Mn (at %) when the krypton flow rate is 10 to 50% against argon. Because the component ratio much affects the magnetic property of a product, it is significant to determine the optimum gas flow rates. In the case of IrMn film as well, it is significant to control the gas mixture ratio in an optimum range to obtain the desired components ratio of the film for a high magnetic property. From the described point of view, xenon is supposedly more preferable to krypton if it is required to deposit a film including another kind of atoms with much larger atomic number.

Anyway, because reduction of the interlayer coupling is enabled in this embodiment as well, it is possible to manufacture a high-quality TMR film where magnetic moment in the free-magnetization layer is not captured to be restricted by magnetic moment in the pinned-magnetization layer. Therefore, it is much preferable for a magnetic readout head and MRAM. It accompanies neither increase of the apparatus cost nor decrease of the productivity, because no extra step such as plasma treatment is added.

It is understood that application of the third embodiment to the first or second embodiment would brings a more preferable result. Concretely, the gas introduction line 37 for the deposition chamber 3 shown in FIG. 2 is modified so as to introduce ArKr mix as the sputtering gas, and modified so as to add oxygen thereto. In addition to the effect of the oxygen gas addition, the effect by the mixed krypton gas is obtained in the tantalum film deposition for the seed layer 21 or the PtMn film deposition for the antiferromagnetic layer 23. Therefore, the film is supposedly fattened further, reducing the interlayer coupling further.

It should be noted that a magnetoresistive multilayer film manufacture by the method or the apparatus of this invention is not limited to the described SV-GMR film nor TMR film. In the structure of the magnetoresistive multilayer film manufactured by this invention, any other layer may be interposed therebetween as far as a required magnetoresistive effect is obtained. In the described embodiments, the seed layer is the example of extra layers provided between the substrate and the antiferromagnetic layer. Oxygen gas addition may be carried out in a film deposition for any other extra layer if it is provided. Though this invention has the merit that no extra step is required for reducing the interlayer coupling as described, this invention does not exclude addition of any extra step. In this specification, such an expression as "depositing a film on a substrate" or "depositing a film on a layer" does not always mean the film is deposited as contacted on the substrate or the layer. It includes the film is deposited apart from the substrate or the layer.

What is claimed is:

1. A method for manufacturing a magnetoresistive multilayer film, comprising:

laminating an antiferromagnetic layer, a pinned-magnetization layer, a nonmagnetic spacer layer and a free-magnetization layer in this order on a substrate;

depositing a film for the antiferromagnetic layer by a sputtering process as oxygen gas is added to a gas for sputtering; and depositing films for the pinned-magnetization layer, the nonmagnetic spacer layer and the free-magnetization layer by sputtering processes as oxygen gas is not added to a gas for sputtering, wherein the film for the antiferromagnetic layer is made of PtMn alloy or IrMn alloy.

2. A method for manufacturing a magnetoresistive multilayer film, comprising:

laminating an extra layer, an antiferromagnetic layer, a pinned-magnetization layer, a nonmagnetic spacer layer and a free-magnetization layer in this order on a substrate;

depositing a film for the extra layer by a sputtering process as oxygen gas is added to a gas for sputtering;

depositing a film for the antiferromagnetic layer by a sputtering process as oxygen gas is added to a gas for sputtering; and depositing films for the pinned-magnetization layer, the nonmagnetic spacer layer and the free-magnetization layer by sputtering processes as oxygen gas is not added to a gas for sputtering, wherein the film for the antiferromagnetic layer is made of PtMn alloy or IrMn alloy.

3. A method for manufacturing a magnetoresistive multilayer film as claimed in claim 2, wherein:

the extra layer is a seed layer; and the film for the extra layer is made of tantalum.

4. A method for manufacturing a magnetoresistive multilayer film as claimed in claim 1, further comprising:

providing an extra layer between the substrate and the antiferromagnetic layer; and depositing a film for the extra layer by a sputtering process as oxygen gas is added to a gas for sputtering.

5. A method for manufacturing a magnetoresistive multilayer film as claimed in claim 4, wherein:

the extra layer is a seed layer; and the film for the extra layer is made of tantalum.

6. A method for manufacturing a magnetoresistive multilayer film as claimed in claim 1, wherein:

in the pinned-magnetization layer, a direction of magnetization is pinned by coupling with the antiferromagnetic layer; and in the free-magnetization layer, a direction of magnetization is free.

7. A method for manufacturing a magnetoresistive multilayer film as claimed in claim 2, wherein:

in the pinned-magnetization layer, a direction of magnetization is pinned by coupling with the antiferromagnetic layer; and in the free-magnetization layer, a direction of magnetization is free.

8. A method for manufacturing a magnetoresistive multilayer film as claimed in claim 3, wherein the seed layer controls crystal orientations in another layer laminated thereon.

9. A method for manufacturing a magnetoresistive multilayer film as claimed in claim 5, wherein the seed layer controls crystal orientations in another layer laminated thereon.

* * * * *